United States Patent
Roessler et al.

(10) Patent No.: US 6,335,671 B1
(45) Date of Patent: Jan. 1, 2002

(54) SURFACE MOUNT CIRCUIT ASSEMBLY

(75) Inventors: Robert Joseph Roessler, Rowlett; Matthew Anthony Wilkowski, Mesquite; William Lonzo Woods, Jr., Kaufman; Arthur R. Martin, Rowlett, all of TX (US)

(73) Assignee: Tyco Electronics Logistics AG, Mesquite, TX (US)

( * ) Notice: Subject to any disclaimer, the term of this patent is extended or adjusted under 35 U.S.C. 154(b) by 0 days.

(21) Appl. No.: 09/378,138

(22) Filed: Aug. 20, 1999

(51) Int. Cl.[7] ............................................. H01F 27/06
(52) U.S. Cl. ............................ 336/65; 336/83; 336/192
(58) Field of Search ............................... 336/65, 83, 183, 336/212, 192, 198

(56) References Cited

U.S. PATENT DOCUMENTS

| | | | | |
|---|---|---|---|---|
| 5,463,365 A | * | 10/1995 | Iwatani et al. | 336/98 |
| 5,952,909 A | * | 9/1999 | Umeno et al. | 336/192 |
| 6,081,180 A | * | 6/2000 | Fernandez et al. | 336/90 |

* cited by examiner

Primary Examiner—Lincoln Donovan
Assistant Examiner—Tuyen T. Nguyen
(74) Attorney, Agent, or Firm—Locke Liddell & Sapp LLP

(57) ABSTRACT

A surface mount core assembly comprises a header with breakaway support rails. The breakaway support rails are used in the manufacturing process to maximize the core window of the assembly, and may be removed to minimize the footprint of the assembly. In the present embodiment, the assembly comprises, for example, a transformer wherein prefabricated conductor rings are used to further maximize the fill of the core window with conductor material.

3 Claims, 5 Drawing Sheets

SURFACE MOUNT CIRCUIT ASSEMBLY

BACKGROUND OF THE INVENTION

1. Field of the Invention

The present invention relates to surface mounting of integrated circuits for use in connection with the manufacture of circuit boards. The surface mount circuit assembly comprises a breakaway support structure which has particular utility in connection with small footprint, high volume, pick-and-place surface mount devices and integrated circuit chips with power demands that require low-profile components and high core window density.

2. Description of Related Information

Early methods of circuit board integration and design used standard multi-layer board construction. Multi-layer construction is a chemical process. The process results in imprecise resistance and limits the amount of copper that can be used in the core window. Additionally, a pre-preg, or B-stage material, is used to adhere the multiple layers together, and resin from this material is used to fill voids left by the etching process and to prevent isolation breakdown between primary and secondary windings. Because of interleaving, the use of resin as fill material is often unavoidable. Consequently, the multi-layer board becomes a mix of the conducting material, which is usually copper, and the pre-preg. Once a header or molding compound is added above and below the multi-layer board, as much as 65% of the window may be non-copper.

Additionally, all electrical contacts emanating from a board must constitute a planar surface for surface mounting to a level surface. When surface mount leads are on different edges of a board, the board must be unitary or otherwise secured to maintain the leads on a single plane. Current designs use a unitary design, or connect sections of the board across the build area. Connectors across the build area occupy space that could be used for copper, adding more material and height to the design.

Current state-of-the-art circuit board design requires low-voltage, high-current power supplies. Overall board height requirements have not increased, so low-profile power supplies are also required, and the amount of fill should be kept to a minimum. To efficiently conduct high-current, low-voltage power to chips on a board, the core window should primarily be comprised of a conductor, rather than resin or adhesive. Additionally, such a structure must allow a low profile component.

A need exists, therefore, for an apparatus that allows a material with greater conductivity to be used in the core window and that minimizes the header footprint for a low profile. A need also exists for an apparatus to prevent the header or molding compound from entering the core window or otherwise decreasing the conductivity of the core window.

SUMMARY OF THE INVENTION

The apparatus of the present invention overcomes the above-mentioned disadvantages and drawbacks which are characteristic of the related information. The method of the present invention eliminates or minimizes the need for pre-preg, or B-stage material, and prevents board supports from occupying space that could more efficiently be used by conductor material, allowing greater conductor content in the core window, and allowing the core window to reside lower relative to the board. The apparatus of the present invention allows for a header to be used in the manufacturing process of a core assembly, but prevents the header from limiting the space in the core window of the core assembly.

The present invention employs a header with breakaway support rails. The support rails facilitate assembly of the unit, but are removable to minimize the height and footprint of the assembly. The breakaway support rails allow the use of the core window to be maximized for a given core assembly height.

Additionally, a plurality of prefabricated conductors are enclosed in an insulating material and positioned around a core post in the core window. Each prefabricated conductor mounts to two or more of the connector pins, thereby creating an electrical connection between the pins so connected. The prefabricated conductors allow a precise connection of known resistance, facilitate assembly, and minimize the use of pre-preg. Such prefabricated conductors are known in the art, but the use of such prefabricated conductors minimizes the stack height of conductors within the core window, further minimizing the height of the assembly.

Numerous objects, features and advantages of the present invention will be readily apparent to those of ordinary skill in the art upon a reading of the following detailed description of presently preferred, but nonetheless illustrative, embodiments of the present invention when taken in conjunction with the accompanying drawings.

DESCRIPTION OF THE PREFERRED EMBODIMENTS

Figure 1:
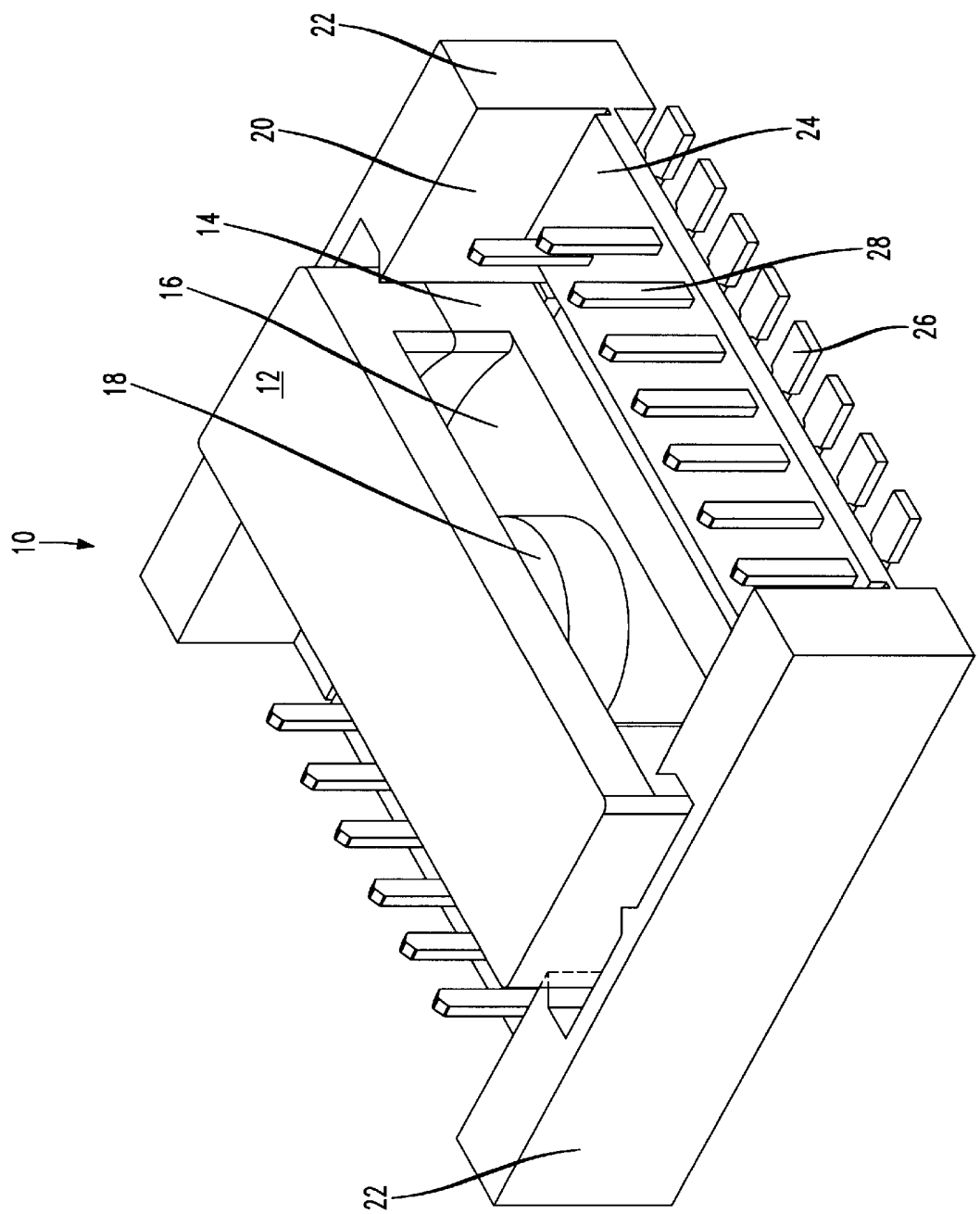
FIG. 1 is an elevated view of the assembly of the present invention.

Referring now to the drawings, and particularly to FIGS. 1–5, a preferred embodiment of the core assembly of the present invention is shown and generally designated by the reference numeral 10.

As shown in FIG. 1, the core assembly 10 of the present invention comprises an upper core portion 12 and a lower core portion 14 that join to form a core window 16 with a center post 18. The upper core portion 12 and the lower core portion 14 are molded of ferrite in the present embodiment, thereby allowing the center post 18 to carry a magnetic flux in the present application, which is a transformer assembly.

The core assembly 10 further comprises a header 20, which includes support rails 22 and terminal plates 24 with integral surface mount terminals 26 connected to connector pins 28. The surface mount terminals 26 allow the core assembly 10 to be surface mounted to a printed circuit board. Those skilled in the art will readily recognize that other mounting methods may be used. A plurality of connector pins 28 extend from the terminal plates 24. In the present embodiment, each connector pin 28 is electrically connected to a single surface mount terminal 26, the terminal plates 24 are deployed along two opposite sides of the header 20, and two support rails 22 are employed.

Figure 2:
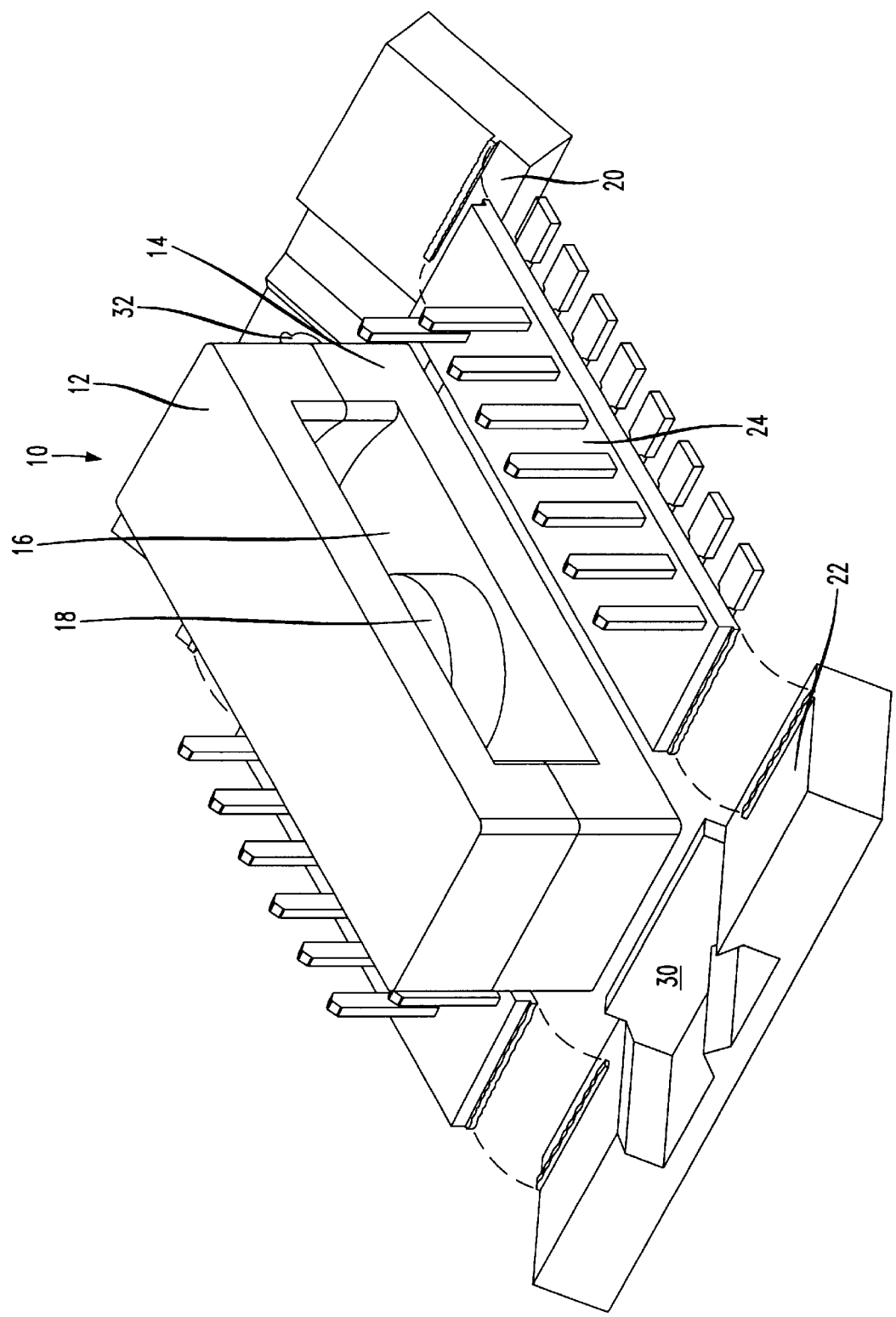
FIG. 2 is an elevated view of the assembly showing the breakaway bobbin.

Turning now to FIG. 2, the support rails 22 of the header 20 may be broken away after the core assembly 10 is assembled. The support rails 22 hold the header 20 together, creating a single molding fixture. In the present embodiment, a pair of support rails 22 form opposite sides of a rectangle with a pair of adjacent terminal plates 24. The support rails 22 secure the terminal plates 24 and allow said terminal plates 24 to be level with the bottom of the lower core portion 14. The support rails 22 also have feet 30, or support ledges, upon which the lower core portion 14 rests during assembly. The feet 30 are lower than the terminal plates 24, which allows a level, planar surface of the lower core portion 14 and the surface mount terminals 26 to be achieved. The use of support rails 22 and feet 30 allow the core 10 to sit much lower than previously known in the art. In previous designs, a terminal plate support structure across the area occupied by the core 10 connected the terminal plates 24. This support structure made the core sit higher, which meant the overall device was higher, or the size of the core window had to be decreased to meet height requirements. The support rails 22 allow a larger core with the same or less height, but add to the footprint of the assembly. To minimize the footprint, the support rails 22 are removable.

The core 10 is also depicted in FIG. 2. The core 10 comprises a lower core portion 14 and an upper core portion 12. The lower core portion 14 rests upon the feet 30 of the support rails 22 of the header 20 during assembly. The upper core portion 12 is placed on top of said lower core portion 14. As previously mentioned, the core 10 comprises a housing that forms a core window 16 with a center core post 18 therein.

In final assembly of the present invention, a stack of prefabricated conductor rings are employed to connect connecting pins 28 on opposite terminal plates and encircle the core post 18 to form a transformer. The prefabricated conductor rings comprise a conductor, such as copper, surrounded by an insulator, such as kapton, polymide or mylar. Such prefabricated conductor rings are known in the art, but their use in the current application reduces the amount of prepreg used to fill the core window 16, thereby reducing the overall height requirement of the window. For purposes of showing core assembly details and focusing on the novel portions of the present invention, the prefabricated conductors are not shown in FIG. 2, but are part of the final assembly of the present invention. Those skilled in the art will recognize that other methods and apparati, such as multi-layer boards, may be used to connect connector pins on opposite terminal plates.

Figure 3:
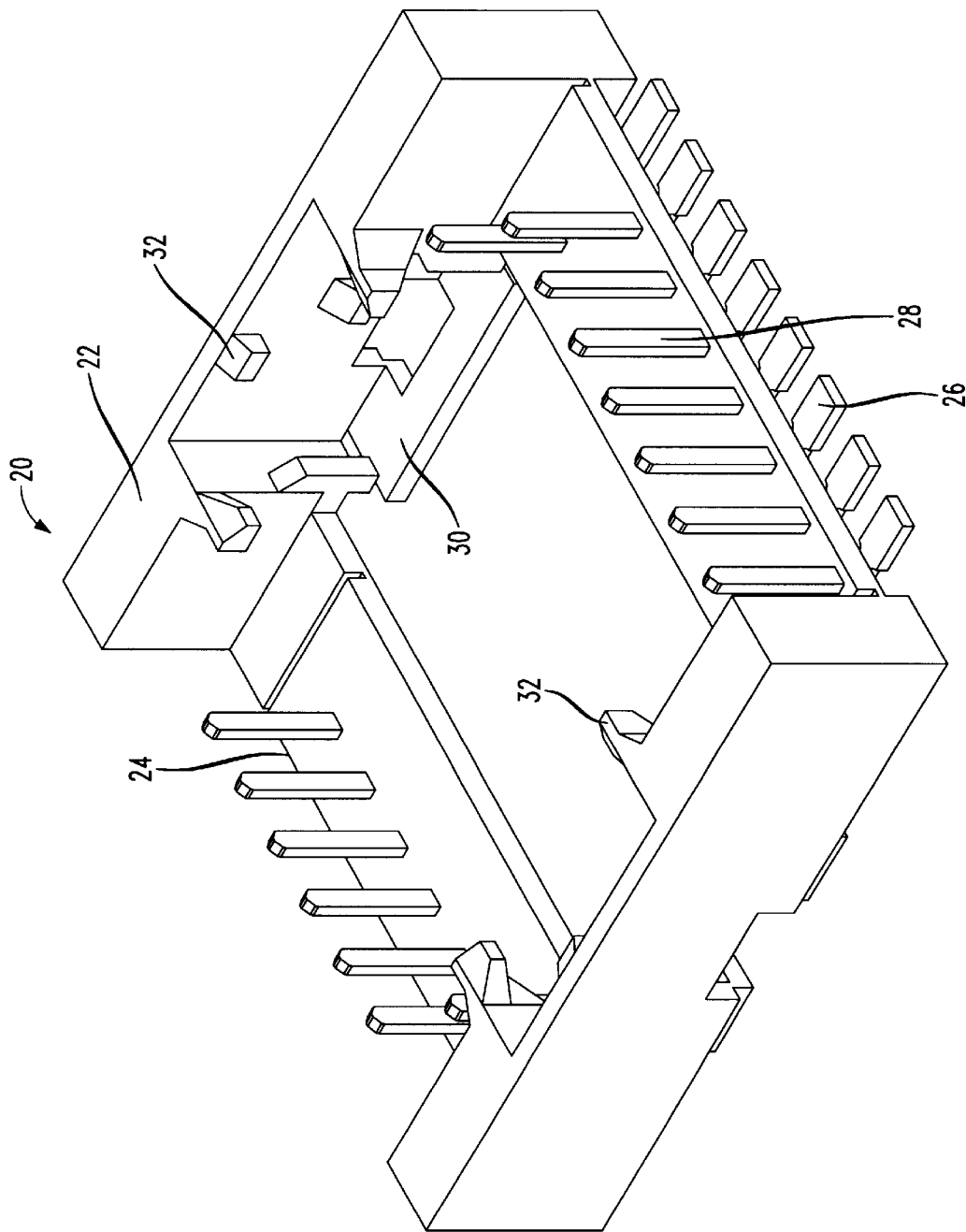
FIG. 3 is an elevated view of the header of the present invention.

Turning now to FIG. 3, a header 20 of the present invention is depicted therein. The header 20 comprises opposite breakaway support rails 22 adjacent to a pair of terminal plates 24. The terminal plates 24 include integral connector pins 28 and surface mount terminals 26. The breakaway support rails 22 are designed for both ease of manufacture and for clean breakaway. The rails include a foot 30 upon which the lower core portion can rest for ease of assembly. The foot 30 is designed to ensure the bottom of the lower core portion is level with the terminal plate 24. The foot 30 provides coplanar alignment of the bottom of the core with surface mount terminals 26, maximizing the space available for prefabricated conductor rings while ensuring proper alignment for surface mounting of the device. The rails 22 also include offset spacers 10. The offset spacers 10 minimize contact with the core, preventing glue used to secure the upper and lower core portions, or pre-preg or B-stage material, from adhering to the rails 22, thus ensuring a clean breakaway.

Figure 4:
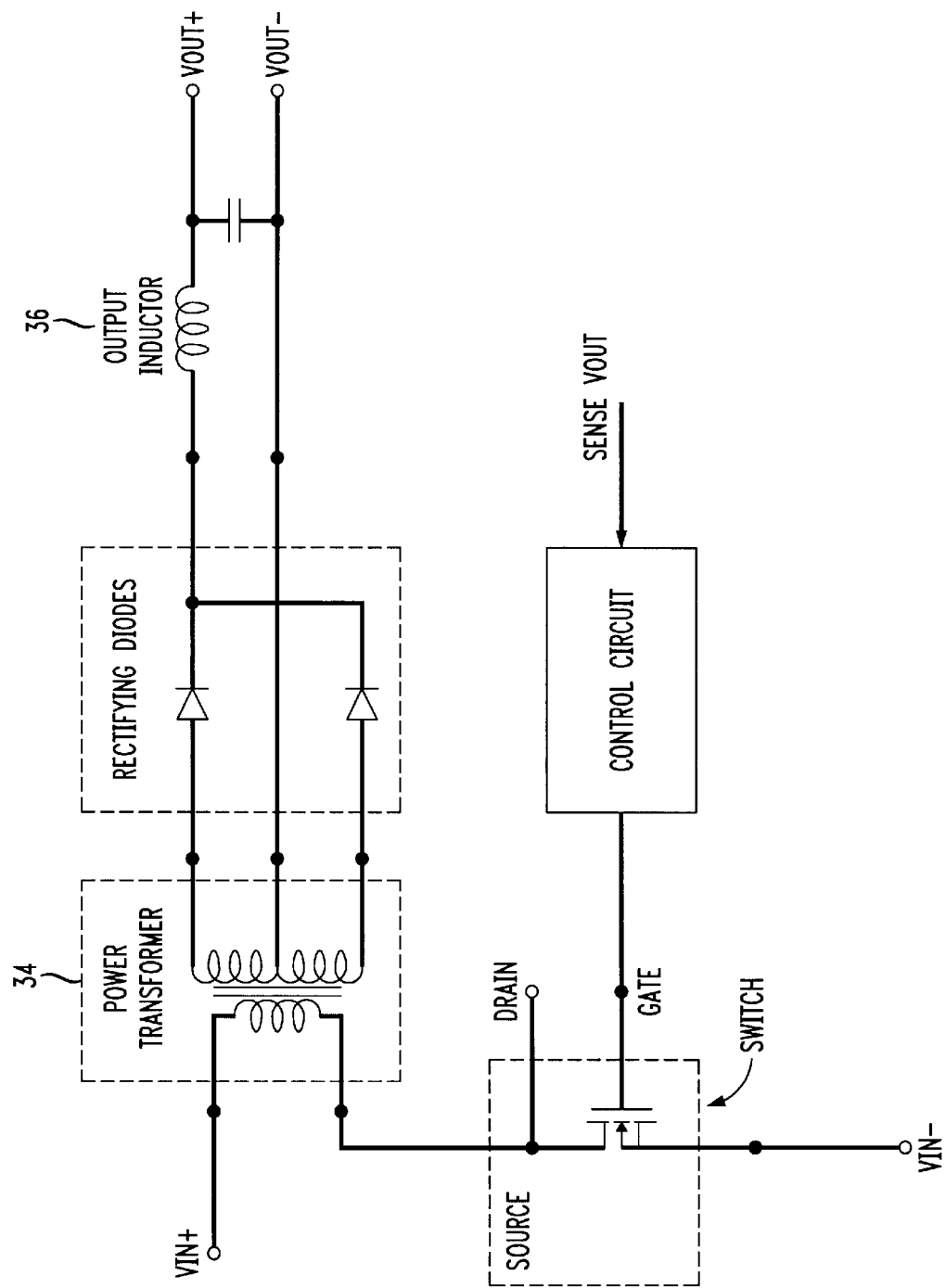
FIG. 4 is a circuit diagram showing exemplary uses of the components that can be placed and assembled according to the present invention.

Referring to FIG. 4, a circuit diagram exemplifies a typical circuit in which the present invention would find application. Both the power transformer 34 and the output inductor 36 can be fabricated in accordance with this invention. For both assemblies, prefabricated conductor rings can be placed on center posts 18 in core windows 16 as shown in FIGS. 1–3. After suitable alignment with connector pins 28 and placement of upper core portion 12, support rails 22 can be removed for surface mounting of the assembly.

Figure 5:
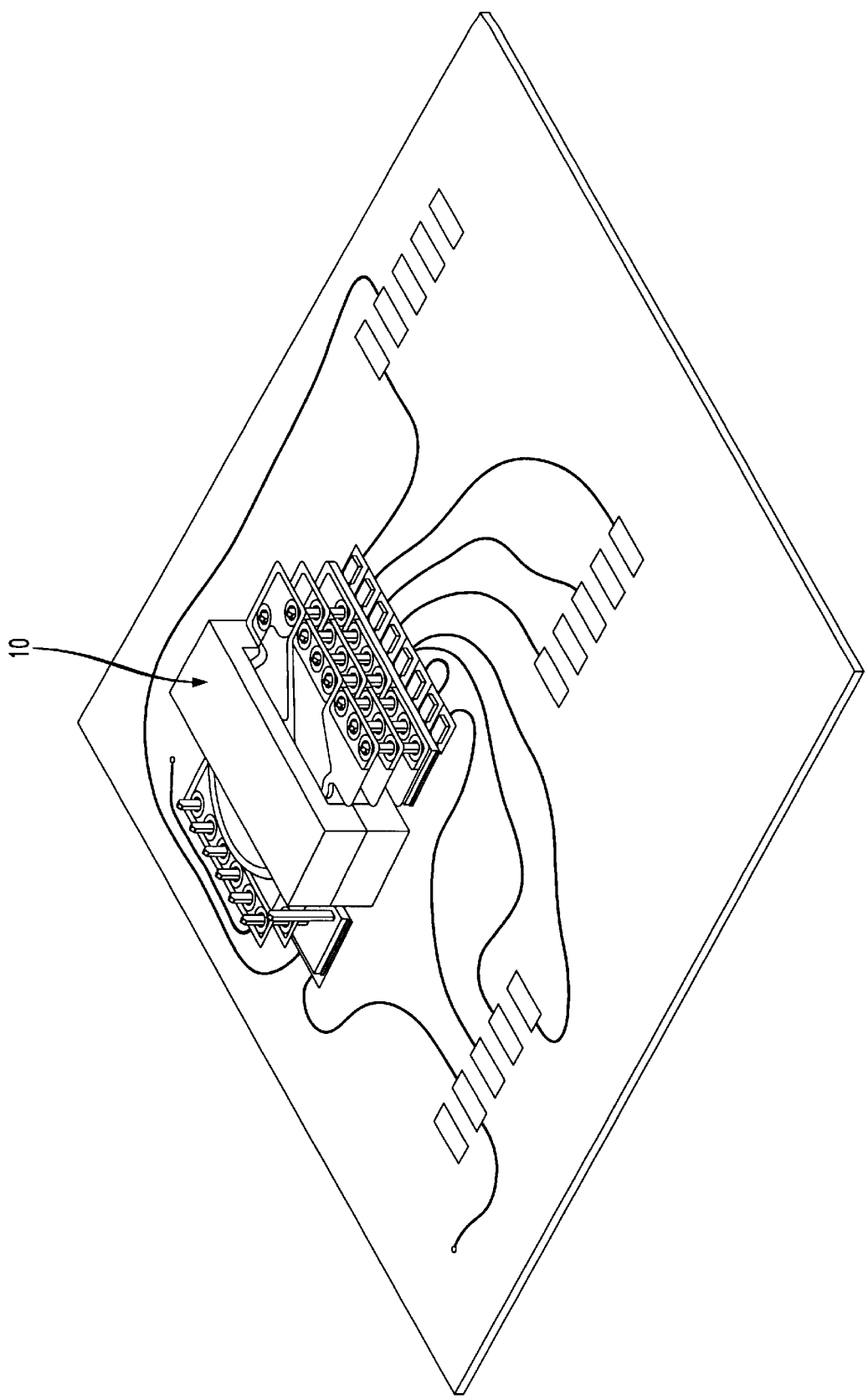
FIG. 5 is an elevated view of a circuit board with an assembled device in place and the support rails removed.

FIG. 5 depicts a device assembled using the present invention, surface mounted on a circuit board, with the breakaway rails 22 removed.

While a preferred embodiment of the circuit assembly has been described in detail, it should be apparent that modifications and variations thereto are possible, all of which fall within the true spirit and scope of the invention. For example, any suitable conductor may be used instead of the copper described. Also, although the present invention is optimized for a transformer, it should be appreciated that the assembly herein described is suitable for housing a wide array of magnetic devices.

What is claimed is:

1. A component assembly comprising:
    an E-shaped core portion having first and second spaced apart sides and first and second spaced apart ends, said sides and said ends defining a window;
    a core post disposed within said window;
    a header portion including first and second spaced apart terminal plates, said first terminal plate being disposed adjacent to said first side of said core portion and said second terminal plate being disposed adjacent to said second side of said core portion, said terminal plates each including a plurality of plate terminals;
    a first rail connected to said first and second terminal plates along an intermediate fracture line and being disposed adjacent to said first end of said core portion;
    a second rail connected to said first and second terminal plates along an intermediate fracture line and being disposed adjacent to said second end of said core portion;
    a plurality of individual core windings disposed around said core post, each of said plurality of individual core windings including a plurality of winding terminals extending to ones of said plurality of plate terminals of said first and second terminal plates for connection thereto; and
    each of said rails being severable from said terminal plates along said fracture lines and when said rails are severed, said rails are free of said first and second terminal plates, such that said rails are removable from said first and second terminal plates to thereby decrease an external dimension of the core assembly after said plurality of individual core windings are connected to said plate terminals of said first and second terminal plates.

2. The component assembly of claim 1 wherein said rails include a ledge for supporting said core portion.

3. The component assembly of claim 1 wherein said rails include a spacer to separate said rails from said core portion.

* * * * *